US012398291B2

United States Patent
McDonough et al.

(10) Patent No.: US 12,398,291 B2
(45) Date of Patent: Aug. 26, 2025

(54) POLISHING COMPOSITIONS AND METHODS OF USE THEREOF

(71) Applicant: Fujifilm Electronic Materials U.S.A., Inc., N. Kingstown, RI (US)

(72) Inventors: James McDonough, Gilbert, AZ (US);
Ting-Kai Huang, Tainan (TW);
Yannan Liang, Gilbert, AZ (US);
Shu-Wei Chang, Taoyuan (TW); Sung Tsai Lin, Taoyuan (TW); Liqing Wen, Mesa, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 851 days.

(21) Appl. No.: 17/214,987

(22) Filed: Mar. 29, 2021

(65) Prior Publication Data

US 2021/0301177 A1    Sep. 30, 2021

Related U.S. Application Data

(60) Provisional application No. 63/002,537, filed on Mar. 31, 2020.

(51) Int. Cl.
| | |
|---|---|
| *C11D 3/28* | (2006.01) |
| *C09G 1/02* | (2006.01) |
| *C11D 1/34* | (2006.01) |
| *C11D 3/14* | (2006.01) |
| *C11D 3/20* | (2006.01) |
| *C11D 3/34* | (2006.01) |

(Continued)

(52) U.S. Cl.
CPC ............... *C09G 1/02* (2013.01); *C11D 1/345* (2013.01); *C11D 3/14* (2013.01); *C11D 3/2075* (2013.01); *C11D 3/2079* (2013.01); *C11D 3/2082* (2013.01); *C11D 3/2086* (2013.01); *C11D 3/28* (2013.01); *C11D 3/361* (2013.01); *C11D 3/362* (2013.01); *C23F 11/1676* (2013.01); *H01L 21/3212* (2013.01)

(58) Field of Classification Search
CPC ..... C11D 1/345; C11D 1/2075; C11D 3/2075; C11D 3/2079; C11D 3/2082; C11D 3/2086; C11D 3/361; C11D 3/362; C11D 3/28
USPC ........ 510/175, 178, 467, 477, 488, 499, 500
See application file for complete search history.

(56) References Cited

U.S. PATENT DOCUMENTS

| | | | |
|---|---|---|---|
| 6,228,283 B1 | 5/2001 | Turcotte et al. | |
| 2003/0096500 A1 | 5/2003 | Kneer | |

(Continued)

FOREIGN PATENT DOCUMENTS

| | | |
|---|---|---|
| CN | 1522292 A | 8/2004 |
| CN | 102101982 A | 6/2011 |

(Continued)

OTHER PUBLICATIONS

Extended European Search Report in European Appln No. 21779669, dated Oct. 5, 2023, 13 pages.

(Continued)

*Primary Examiner* — Gregory R Delcotto
(74) *Attorney, Agent, or Firm* — Fish & Richardson P.C.

(57) ABSTRACT

This disclosure features a polishing composition that includes at least one abrasive; at least one first corrosion inhibitor that includes a phosphate or a phosphonate group; at least one complexing agent; at least one second corrosion inhibitor that is at least one azole compound; and optionally a pH adjuster.

21 Claims, 3 Drawing Sheets

(51) Int. Cl.
*C11D 3/36* (2006.01)
*C23F 11/167* (2006.01)
*H01L 21/321* (2006.01)

(56) References Cited

U.S. PATENT DOCUMENTS

| | | | |
|---|---|---|---|
| 2003/0119692 A1 | 6/2003 | So et al. | |
| 2003/0207778 A1 | 11/2003 | So et al. | |
| 2015/0221521 A1* | 8/2015 | Hou | H01L 21/31058 438/693 |
| 2015/0376423 A1 | 12/2015 | Kadowaki | |
| 2016/0108286 A1* | 4/2016 | Sikma | B24B 37/044 252/79.1 |
| 2017/0358438 A1 | 12/2017 | Bazargan et al. | |
| 2018/0002571 A1 | 1/2018 | Stender et al. | |
| 2018/0187047 A1 | 7/2018 | McDonough | |
| 2021/0115302 A1* | 4/2021 | Johnson | C01F 17/241 |

FOREIGN PATENT DOCUMENTS

| | | | | |
|---|---|---|---|---|
| CN | 102453439 | A | 5/2012 | |
| CN | 102533118 | A | 7/2012 | |
| CN | 103547651 | | 1/2014 | |
| CN | 103865400 | A | 6/2014 | |
| CN | 103866326 | A | 6/2014 | |
| CN | 106929858 | A | 7/2017 | |
| CN | 107523219 | A | 12/2017 | |
| CN | 108264850 | A | 7/2018 | |
| CN | 108929633 | A | 12/2018 | |
| EP | 1288338 | A1 * | 3/2003 | C08F 22/40 |
| EP | 2693460 | A1 | 2/2014 | |
| EP | 3476910 | A1 * | 5/2019 | B24B 37/044 |
| JP | 2009-283951 | A1 | 12/2009 | |
| JP | 2018-019075 | A | 2/2018 | |
| WO | WO-2015120269 | A1 * | 8/2015 | C09G 1/02 |
| WO | WO 2017/114301 | A1 | 7/2017 | |
| WO | WO 2020/020859 | | 1/2020 | |

OTHER PUBLICATIONS

Office Action in Chinese Appln. No. 202180002187.7, dated Nov. 3, 2023, 18 pages (with English translation).
International Search Report and Written Opinion of the International Searching Authority for International Application No. PCT/US2021/024592, dated Jun. 8, 2021.
Office Action in Chinese Appln. No. 202180002187.7, dated Jun. 25, 2024, 13 pages (with English translation).
Search Report in Singapore Appln. No. 11202253379X, mailed on Jun. 4, 2024, 10 pages (with English translation).
Office Action in Chinese Appln. No. 202180002187.7, dated Oct. 11, 2024, 15 pages (with English translation).
Office Action in Chinese Appln. No. 202180002187.7, dated Feb. 7, 2025, 17 pages (with English translation).
Office Action in Japanese Appln. No. 2022-560143, dated Feb. 10, 2025, 8 pages (with English translation).

* cited by examiner

POLISHING COMPOSITIONS AND METHODS OF USE THEREOF

CROSS-REFERENCE TO RELATED APPLICATION

The present application claims priority to U.S. Provisional Application Ser. No. 63/002,537, filed on Mar. 31, 2020, the contents of which are hereby incorporated by reference in their entirety.

BACKGROUND

The process known as chemical-mechanical polishing (CMP) involves polishing different metal or non-metal layers on semiconductor wafers, using a polish pad and a polishing composition. Copper is a commonly used material for forming interconnects in semiconductor manufacturing. Once a copper inlaid structure is formed by, for example, a damascene process, the isolated copper wires are exposed by a polishing process that removes copper and barrier metal between the inlaid wires. Copper bulk and copper barrier layer CMP involve polishing of copper and barrier layers. It is desired to perform the polishing at a high removal rate of material to enhance throughput, while still maintaining favorable wafer characteristics such as a low number of overall defects.

A typical copper bulk CMP process generally includes two process steps (i.e., an initial Cu bulk step which removes a substantial majority of the Cu overburden at a high rate followed by a less aggressive clearing step which removes the remainder of the Cu overburden and stops on a barrier layer). First, in the initial Cu bulk polishing step, the electro-plated copper overburden (up to 2 μm in thickness depending on technology node) is rapidly polished down at a relatively high down force, leaving some amount of copper overburden until the deposition topography is substantially planarized. Subsequently, the remaining copper overburden from the first step is polished off at a lower down force, with a stop on the barrier layer. The overall goal is to remove all copper from the barrier material with high throughput and planarization efficiency, while achieving low defects (e.g., copper dishing, scratching, organic residue, etc).

In the above second polishing step, a phenomenon called dishing occurs, where the level of the top surface of the interconnect material (e.g., copper) lowers. This is thought to be attributed to removal of the Cu interconnect material to an excessive degree during an overpolishing process which comes at the tail end of the second polishing step (i.e., the stop on barrier layer). The overpolishing ensures all Cu residue is cleared on the entirety of the wafer surface. During the overpolishing, two factors contribute to the final dishing degree. The first factor is the continued mechanical aggression toward the Cu lines, which occurs as the polish pad conforms around features and maintains mechanical contact with recessed Cu lines to further polish them throughout the duration of the overpolishing. The second factor is continued chemical etching of the Cu lines due to continued contact with the polishing composition throughout the overpolishing. Dishing reduces the cross-sectional area of the wiring, thereby causing an undesirable increase in wiring resistance. Dishing also impairs the flatness of the surface of a semiconductor device, thereby shifting the burden to the subsequent copper barrier CMP step to correct that topography imbalance before being able to proceed with forming multi-filmed wiring in the semiconductor device.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, this disclosure features a polishing composition that includes at least one abrasive; at least one first corrosion inhibitor that includes a phosphate or a phosphonate group; at least one complexing agent; at least one second corrosion inhibitor that includes at least one azole compound; and optionally at least one pH adjuster; in which the amount of the at least one first corrosion inhibitor in the polishing composition is an amount such that the polishing composition dissolves from at least about 3% by weight to at most 10% by weight $Cu_2O$ from a solid $Cu_2O$ powder at a weight ratio of $Cu_2O$ to polishing composition of about 1:2500 when the solid $Cu_2O$ powder has an average particle size of from about 0.01 micron to about 500 microns and is immersed in the polishing composition at 25° C. for two minutes to form a mixture, the mixture is centrifuged to form a supernatant, and the amount of Cu ions dissolved in the supernatant is measured by ICP-MS.

In another aspect, this disclosure features a polishing composition that includes at least one abrasive; at least one first corrosion inhibitor that includes a phosphate or a phosphonate group; at least one complexing agent; at least one second corrosion inhibitor that includes at least one azole compound; in which the amount of the at least one first corrosion inhibitor in the polishing composition is such that, when a 4 cm×4 cm copper containing patterned coupon is immersed in 50 g of the polishing composition at 45° C. for 5 minutes to form a mixture, the amount of the Cu species in the mixture is from about 1 ppm to about 10 ppm as measured by ICP-MS.

In another aspect, this disclosure features a method of polishing a substrate, the method including contacting copper on a surface of the substrate with the polishing composition described herein.

Other aspects and advantages of the claimed subject matter will be apparent from the following description and the appended claims.

DETAILED DESCRIPTION

Figure 1:
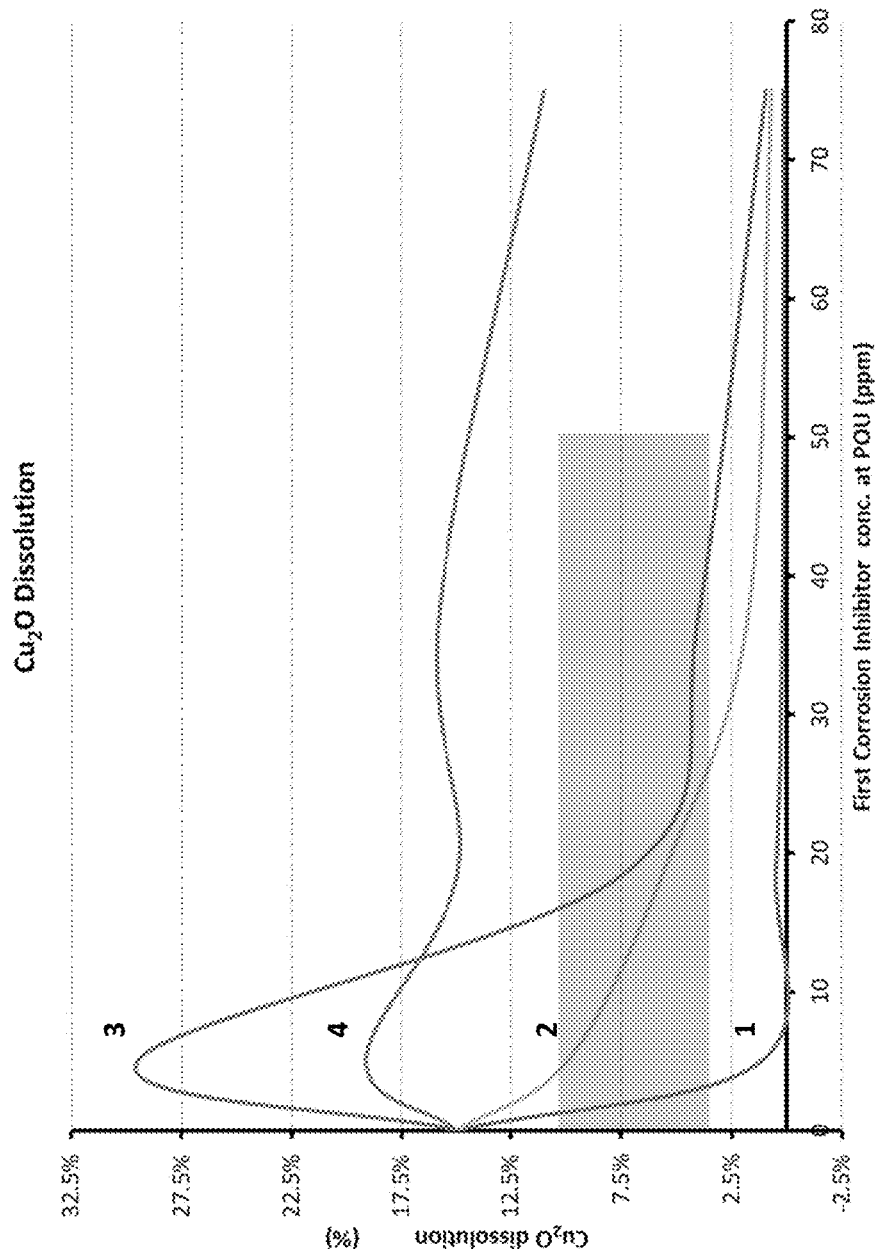
FIG. 1 is a plot illustrating the $Cu_2O$ dissolution by polishing compositions containing four different first corrosion inhibitors at various POU concentrations.

As defined herein, unless otherwise noted, all percentages expressed should be understood to be percentages by weight to the total weight of a composition. The term "solvent" mentioned herein, unless otherwise noted, refers to a single solvent or a combination of two or more (e.g., three or four) solvents. In the present disclosure, "ppm" means "parts-per-million" and "ppb" means "parts-per-billion", based on the total weight of a composition.

A goal in the CMP process is to clear all copper from the barrier layer, but achieve significantly low dishing on the inlaid copper wire, with very few defects and low surface roughness. Thus, a polishing composition must achieve a careful balance of facilitating the removal of copper but not being too capable of removing copper so as to cause undesirably high dishing and/or corrosion (e.g., galvanic corrosion). To this end, compounds functioning as corrosion inhibitors have been added to CMP compositions. Although this approach has met with some success, copper residue remaining on the wafer can be problematic when the concentration of corrosion inhibitor used is too high.

Due to the presence of an oxidizer in polishing compositions, copper oxides are commonly formed on the surface of exposed copper during a polishing process, and in order to polish the copper effectively (i.e., at an acceptable rate, minimizing defects, etc.), additives that modulate the dissolution/removability of these copper oxides are highly important. Ultimately, an effective polishing composition generally can achieve a desirable balance of controlled chemical passive film formation (e.g., a predominantly $CuO/Cu_2O$ passive film) with mechanical film removal to achieve both sufficient Cu protection against corrosion but also sufficient Cu removal rates. Corrosion inhibitors in the slurry can help regulate the aggression of the slurry oxidizer and work in combination with complexing agents to control the properties of the surface passivation film such as mechanical integrity, porosity, thickness, & solubility. Different classes of copper corrosion inhibitors have different affinities for copper (e.g., through lone pair electrons and/or π electrons), different copper protection mechanisms, different diffusion characteristics and time scales of operations, different temperature dependence, and different wettabilities and solubilities once bound to Cu, so a combination of multiple Cu corrosion inhibitors often offers advantages compared to using a single corrosion inhibitor. In general, corrosion inhibitors can facilitate polishing when used in a correct amount but also harm polishing if not used in a correct amount (e.g., too little leads to excessive corrosion and too much leads to copper residue and/or unacceptably low Cu polishing rates).

In one or more embodiments, the polishing compositions described herein can achieve minimal dishing and corrosion (i.e., galvanic corrosion), while minimizing the amount of corrosion inhibitors used. The deleterious effects of high corrosion inhibitor levels (i.e., poor copper clearance rates and/or residue defects) can thereby be avoided or minimized when employing the compositions of the disclosure.

In one or more embodiments, the polishing compositions described herein can include at least one abrasive; at least one first corrosion inhibitor that includes a phosphate or a phosphonate group; at least one complexing agent; at least one second corrosion inhibitor that includes at least one azole compound; and optionally at least one pH adjuster. Optionally, a dynamic surface tension reducer can be included in the polishing compositions described herein.

In one or more embodiments, a polishing composition according to the present disclosure can include from about 0.01% to about 50% by weight of at least one abrasive, from about 0% to about 1% by weight of at least one pH adjuster, from about 0.0001% to about 0.2% by weight of at least one first corrosion inhibitor, from about 0.01% to about 20% by weight of at least one complexing agent, from about 0.0001% to about 5% by weight of at least one second corrosion inhibitor, and the remaining percent by weight (e.g., from about 20% to about 99% by weight) of solvent (e.g., deionized water).

In one or more embodiments, the present disclosure provides a concentrated polishing composition that can be diluted with water prior to use by up to a factor of two, or up to a factor of four, or up to a factor of six, or up to a factor of eight, or up to a factor of ten, or up to a factor of 15, or up to a factor of 20. In other embodiments, the present disclosure provides a point-of-use (POU) polishing composition for use on copper containing substrates, comprising the above-described polishing composition, water, and optionally an oxidizer.

In one or more embodiments, a POU polishing composition can include from about 0.01% to about 25% by weight of at least one abrasive, from about 0 to about 0.5% by weight of at least one pH adjuster, from about 0.0001% to about 0.01% by weight of at least one first corrosion inhibitor, from about 0.01% to about 10% by weight of at least one complexing agent, from about 0.0001% to about 2.5% by weight of at least one second corrosion inhibitor, and the remaining percent by weight (e.g., from about 50% to about 99% by weight) of solvent (e.g., deionized water).

In one or more embodiments, a concentrated polishing composition can include from about 0.01% to about 50% by weight of at least one abrasive, from about 0 to about 1% by weight of at least one pH adjuster, from about 0.002% to about 0.2% by weight of at least one first corrosion inhibitor, about 0.2% to about 20% by weight of at least one complexing agent, about 0.002% to about 5% by weight of at least one second corrosion inhibitor, and the remaining percent by weight (e.g., from about 20% to about 99% by weight) of solvent (e.g., deionized water).

In one or more embodiments, the at least one (e.g., two or three) abrasive is selected from the group consisting of cationic abrasives, substantially neutral abrasives, and anionic abrasives. In one or more embodiments, the at least one abrasive is selected from the group consisting of alumina, silica, titania, ceria, zirconia, co-formed products thereof (i.e., co-formed products of alumina, silica, titania, ceria, or zirconia), coated abrasives, surface modified abrasives, and mixtures thereof. In some embodiments, the at least one abrasive does not include ceria. In some embodiments, the at least one abrasive has a high purity, and can have less than about 100 ppm of alcohol, less than about 100 ppm of ammonia, and less than about 100 ppb of an alkali cation such as sodium cation. The abrasive can be present in an amount of from about 0.01% to about 12% (e.g., from about 0.5% to about 10%), based on the total weight of a POU polishing composition, or any subranges thereof.

In one or more embodiments, the at least one abrasive is in an amount of from at least about 0.01% (e.g., at least about 0.05%, at least about 0.1%, at least about 0.2%, at least about 0.4%, at least about 0.5%, at least about 1%, at least about 1.2%, at least about 1.5%, or at least about 2%) by weight to at most about 50% (e.g., at most about 45%, at most about 40%, at most about 35%, at most about 30%, at most about 25%, at most about 20%, at most about 15%, at most about 12%, at most about 10%, or at most about 5%) by weight of the polishing compositions described herein.

In one or more embodiments, the polishing compositions described herein can optionally include at least one (e.g., two or three) pH adjustor, if necessary, to adjust the pH to a desired value. In some embodiments, the at least one pH adjustor is selected from the group consisting of nitric acid, hydrochloric acid, sulfuric acid, propionic acid, citric acid, malonic acid, hydrobromic acid, hydroiodic acid, perchloric acid, ammonium hydroxide, sodium hydroxide, potassium hydroxide, cesium hydroxide, monoethanolamine, diethanolamine, triethanolamine, methylethanolamine, methyldiethanolamine tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl)methylammonium hydroxide, choline hydroxide, and any combinations thereof.

In one or more embodiments, the at least one pH adjuster is in an amount of from at least about 0.01% (e.g., at least about 0.02%, at least about 0.03%, at least about 0.04%, at least about 0.05%, at least about 0.06%, at least about 0.07%, at least about 0.08%, at least about 0.09%, or at least about 0.1%) by weight to at most about 1% (e.g., at most about 0.9%, at most about 0.8%, at most about 0.7%, at most about 0.6%, at most about 0.5%, at most about 0.4%, at most about 0.3%, at most about 0.2%, at most about 0.1%, at most about 0.08%, at most about 0.06%, or at most about 0.05%) by weight of the polishing compositions described herein.

In one or more embodiments, the pH value of the polishing compositions described herein can range from at least about 6 (e.g., at least about 6.5, at least about 7, at least about 7.5, at least about 8, at least about 8.5, at least about 9, at least about 9.5, at least about 10, at least about 10.5, at least about 11, at least about 11.5, or at least about 12) to at most about 14 (e.g., at most about 13.5, at most about 13, at most about 12.5, at most about 12, at most about 11.5, at most about 11, at least about 10.5, at most about 10, at most about 9.5, at most about 9, at most about 8.5, or at most about 8). Without wishing to be bound by theory, it is believed that a polishing composition having a pH lower than 6 would significantly increase copper removal rate and corrosion, and a polishing composition having a pH higher than 14 can affect the stability of the suspended abrasive and would significantly increase the roughness and decrease the overall quality of a film polished by such a composition. In order to obtain the desired pH, the relative concentrations of the ingredients in the polishing compositions described herein can be adjusted.

In one or more embodiments, the at least one (e.g., two or three) first corrosion inhibitor includes a phosphate or a phosphonate group. Without being bound by theory, it is believed that the first corrosion inhibitor that includes a phosphate or a phosphonate group can passivate the copper surface and form a passivating film (e.g., a $Cu_2O$ or $CuO$ film) that is less permeable to the polishing slurry and thereby render the copper protected from possible dishing and corrosion caused by interaction with the corrosive components in the polishing slurry. However, the inventors have surprisingly found that there is a high variability in the ability of corrosion inhibitors including a phosphate or phosphonate group to effectively passivate and insolubilize the copper oxides and otherwise perform as a corrosion inhibitor during a polishing process. For example, without wishing to be bound by theory, it is believed that, as the organic group attached to the phosphate or phosphonate group in a corrosion inhibitor becomes larger, the use of the corrosion inhibitor generally results in copper surface passivation layers which are undesirably highly insoluble, leading to low copper removal rates and unacceptable copper residue and/or organic residue remaining on the polished surface unless the amount of corrosion inhibitor used in the polishing composition is kept to a minimal amount. In contrast, without wishing to be bound by theory, it is believed that, corrosion inhibitors having a relatively smaller organic group attached to the phosphate or phosphonate group can be relatively less effective in inhibiting copper corrosion and can result in uncontrolled removal of copper from the surface if used in a small amount. In other words, these corrosion inhibitors may be unable to provide adequate corrosion inhibition (i.e., dishing protection, and galvanic corrosion protection) unless used in high amounts so as to saturate the copper surface and outcompete other corrosion inhibitors present in the slurry for available copper surface sites. The high amount of a corrosion inhibitor required can affect the stability of the polishing composition as well as increasing the overall cost of the polishing composition. Based on careful balancing of the considerations above, one can tailor an effective amount of a certain phosphate or phosphonate containing corrosion inhibitor so that it provides dishing protection and galvanic corrosion protection, while not leaving behind copper residue and/or organic residue on the polished surface.

In one or more embodiments, the solubility of copper oxides (e.g., $Cu_2O$ or $CuO$) in the polishing composition can be a proxy measurement of the effectiveness of the polishing composition when polishing a substrate surface that includes copper. For example, in some embodiments, a polishing composition can be said to perform effectively when polishing a substrate surface that includes copper if the total $Cu_2O$ dissolved in the polishing composition after an incubation period is between about 3 wt. % and about 10 wt. % when using a weight ratio of $Cu_2O$ to polishing composition of about 1:2500. In some embodiments, a polishing composition can be said to perform effectively when polishing a substrate surface that includes copper if the total $CuO$ dissolved in a polishing slurry composition an incubation period is between about 0.25 wt. % and about 1.75 wt. %, when using a ratio of $CuO$ to polishing composition of about 1:5000.

In one or more embodiments, the dissolved $Cu_2O$ or $CuO$ can be measured by using the following method: (1) dispersing or immersing a copper oxide (e.g., $Cu_2O$ or $CuO$) powder in a polishing composition sample at 25° C. under agitation to form a mixture, (2) centrifuging the mixture (e.g., at 10000 RPM for 40 minutes), and (3) measuring the concentration of Cu ions in the supernatant, e.g., by using inductively coupled plasma mass spectrometry (ICP-MS). In one or more embodiments, the copper oxide powder can have an average particle size of at least about 0.01 micron (e.g., at least about 0.05 micron, at least about 0.1 micron, at least about 0.5 micron, and at least about 1 micron) and at most about 500 microns (e.g., at most about 250 microns, at most about 100 microns, at most about 50 microns, at most about 25 microns, or at most about 10 microns) and any subranges therebetween. In one or more embodiments, dispersing or immersing the copper oxide (e.g., $Cu_2O$ or $CuO$) in the polishing composition can involve agitating the vessel containing the mixed slurry (e.g., $CuO$ powder and polishing composition) for a period of time. For example the agitating can occur by immersing the vessel containing the mixed slurry into an ultrasonic bath, or by using a vortex mixer, or by using a stir plate, or by using a laboratory rotator, or any other known comparable methods. In one or more embodiments, the vessel containing the mixed slurry can be agitated for between about 2 and 5 minutes.

In some embodiments, a static etching test can be used by incubating patterned coupons in a polishing composition and measuring the dissolved and dispersed copper after the incubation by ICP-MS. In some embodiments, the solubility test can include placing a 4 cm×4 cm copper containing patterned coupon in 50 g of a polishing composition at 45° C. for 5 minutes and then measuring the dissolved and dispersed copper in the polishing composition. In one or more embodiments, the copper containing patterned coupon can be at least one selected from the group consisting of CuTaTaNBD and CuRuTaNTEOS MIT 854 mask 200 mm pattern wafers that have gone through an initial Cu bulk polishing step to substantially remove the copper overburden by completing the clearing, endpoint, and overpolish portions of the Cu bulk polish steps but prior to any barrier polish steps (i.e., the Ta/TaN & Ru/TaN barrier layers are still intact and not removed other than incidental erosion as part of the Cu bulk polish process). In one or more embodiments, the amount of copper dissolved and dispersed in the patterned coupon solubility test can be at least about 1 ppm (e.g., at least about 2 ppm, at least about 3 ppm, at least about 4 ppm, at least about 5 ppm) and at most about 10 ppm (e.g., at most about 9 ppm, at most about 8 ppm, at most about 7 ppm, at most about 6 ppm) of the polishing composition.

In one or more embodiments, the first corrosion inhibitor that includes a phosphate group is selected from at least one of alkyl phosphates, aromatic phosphates, polyoxyethylene alkyl ether phosphates, polyoxyethylene aryl alkyl ether phosphates, polyoxyethylene nonylaryl ether phosphates, and polyoxyethylene nonylphenyl ether phosphates. In one or more embodiments, the first corrosion inhibitor that includes a phosphate group includes an alkyl chain (e.g., linear, branched, or cyclic) with at least 8 (e.g., at least 10, at least 12, at least 14, at least 16, at least 18, or at least 20) carbons to at most 22 (e.g., at most 20, at most 18, at most 16, at most 14, at most 12, or at most 10) carbons. In one or more embodiments, the alkyl chain can be separated from the phosphate group by at least 0 (e.g., at least 2, at least 4, at least 6, at least 8, at least 10, or at least 12) to at most 16 (e.g., at most 14, at most 12, at most 10, at most 8, at most 6, or at most 4) ethylene oxide groups. In one or more embodiments, the first corrosion inhibitor that includes a phosphate group includes an alkyl chain with 8 to 22 carbons that is attached directly to the phosphate group (i.e., without any ethylene oxide group). In one or more embodiments, the first corrosion inhibitor includes a phosphonate group. In one or more embodiments, the first corrosion inhibitor that includes a phosphonate group is selected from at least one of alkyl phosphonates (e.g., including straight chain or branched $C_1$-$C_{10}$ alkyl groups or cyclic $C_3$-$C_{10}$ alkyl groups), aromatic phosphonates (e.g., benzyl phosphonates and phenyl phosphonates), polyoxyethylene alkyl ether phosphonates, polyoxyethylene aryl alkyl ether phosphonates, polyoxyethylene nonylaryl ether phosphonates, and polyoxyethylene nonylphenyl ether phosphonates, and substituted versions thereof.

In one or more embodiments, the amount of the first corrosion inhibitor is from about at least about 0.0001% or 1 ppm (e.g., at least about 0.00025% or 2.5 ppm, at least about 0.0005% or 5 ppm, at least about 0.001% or 10 ppm, at least about 0.0025% or 25 ppm, at least about 0.005% or 50 ppm, or at least about 0.01% or 100 ppm) to at most about 0.2% or 2000 ppm (e.g., at most about 0.15% or 1500 ppm, at most about 0.1% or 1000 ppm, at most about 0.05% or 500 ppm, at most about 0.02% or 200 ppm, at most about 0.01% or 100 ppm, at most about 0.0075% or 75 ppm, at most about 0.005% or 50 ppm, at most about 0.0025 or 25 ppm, at most about 0.001% or 10 ppm, at most about 0.00075% or 7.5 ppm, or at most about 0.0005% or 5 ppm) by weight of the polishing compositions described herein.

In one or more embodiments, the first corrosion inhibitor has a molecular weight that is from at least about 150 g/mol (e.g., at least about 200 g/mol, at least about 250 g/mol, at least about 300 g/mol, at least about 350 g/mol, at least about 400 g/mol, at least about 450 g/mol, at least about 500 g/mol, or at least about 550 g/mol) to at most about 1100 g/mol (e.g., at most about 1050 g/mol, at most about 1000 g/mol, at most about 950 g/mol, at most about 900 g/mol, at most about 850 g/mol, at most about 800 g/mol, at most about 750 g/mol, at most about 700 g/mol, at most about 650 g/mol, or at most about 600 g/mol).

In one or more embodiments, the at least one (e.g., two or three) complexing agent is selected from the group consisting of organic acids, amines (e.g., polyamines), ammonia, quaternary ammonium compounds, inorganic acids, and salts and mixtures thereof. In one or more embodiments, the organic acids may be selected from the group consisting of amino acids, carboxylic acids, organo sulfonic acids, and organo phosphonic acids.

In one or more embodiments, the at least one complexing agent can be selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, ammonia, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethane-sulfonic acid, salts thereof, and mixtures thereof.

In one or more embodiments, the at least one complexing agent is in an amount of from about at least 0.01% (e.g., at least about 0.05%, at least about 0.1%, at least about 0.5%, at least about 1%, at least about 2%, at least about 4%, or at least about 5%, at least about 6%, at least about 8%, at least about 10%, or at least about 15%) to at most 20% (e.g., at most about 18%, at most about 16%, at most about 15%, at most about 14%, at most about 12%, at most about 10%, at most about 8%, at most about 6%, at most about 5%, at most about 4%, at most about 2%, or at most about 1%) by weight of the polishing compositions described herein.

In one or more embodiments, the at least one (e.g., two or three) second corrosion inhibitor can include at least one azole compound, such as a substituted or unsubstituted triazole (e.g., a benzotriazole), a substituted or unsubstituted tetrazole, a substituted or unsubstituted imidazole (e.g., a purine), a substituted or unsubstituted thiadiazole, or a substituted or unsubstituted pyrazole. For example, the at least one second corrosion inhibitor can be selected from the group consisting of tetrazole, benzotriazole, tolyltriazole, methyl benzotriazole (e.g., 1-methyl benzotriazole, 4-methyl benzotriazole, and 5-methyl benzotriazole), ethyl benzotriazole (e.g., 1-ethyl benzotriazole), propyl benzotriazole (e.g., 1-propyl benzotriazole), butyl benzotriazole (e.g., 1-butyl benzotriazole and 5-butyl benzotriazole), pentyl benzotriazole (e.g., 1-pentyl benzotriazole), hexyl benzotriazole (e.g., 1-butyl benzotriazole and 5-butyl benzotriazole), dimethyl benzotriazole (e.g., 5,6-dimethyl benzotriazole), chloro benzotriazole (e.g., 5-chloro benzotriazole), dichloro benzotriazole (e.g., 5,6-dichloro benzotriazole), chloromethyl benzotriazole (e.g., 1-(chloromethyl)-1-H-benzotriazole), chloroethyl benzotriazole, phenyl benzotriazole, benzyl benzotriazole, aminotriazole, aminobenzimidazole, pyrazole, imidazole, aminotetrazole, adenine, benzimidazole, thiabendazole, 1,2,3-triazole, 1,2,4-triazole, 1-hydroxybenzotriazole, 2-methylbenzothiazole, 2-aminobenzimidazole, 2-amino-5-ethyl-1,3,4-thiadiazole, 3,5-diamino-1,2,4-triazole, 3-amino-5-methylpyrazole, 4-amino-4H-1,2,4-triazole, and combinations thereof.

In one or more embodiments, the at least one second corrosion inhibitor is in an amount of from at least about 0.0001% (e.g., at least about 0.0005%, at least about 0.001%, at least about 0.005%, at least about 0.01%, at least about 0.05%, at least about 0.1%, at least about 0.5%, at least about 1%, or at least about 2%) to at most about 5% (e.g., at most about 4%, at most about 3%, at most about 2%, at most about 1%, at most about 0.8%, at most about 0.6%, at most about 0.5%, at most about 0.4%, at most about 0.2%, or at most about 0.1%) by weight of the polishing compositions described herein.

In one or more embodiments, the polishing compositions described herein can include at least one (e.g., two or three) solvents. Suitable solvents include water and organic solvents. In some embodiments, the at least one solvent is in an amount of at least about 20% (e.g., at least about 30%, at least about 40%, at least about 50%, at least about 60%, at least about 70%, at least about 80%, at least about 90%, at least about 95%, or at least about 98%) to at most about 99% (e.g., at most about 95%, at most about 90%, at most about 85%, at most about 80%, at most about 75%, at most about 70%, at most about 65%, at most about 60%, at most about 55%, or at most about 50%) by weight of the polishing compositions described herein.

In one or more embodiments, an optional secondary solvent (e.g., an organic solvent) can be used in the polish composition (e.g., the POU or concentrated polishing composition) of the present disclosure, which can help with the dissolution of the azole-containing corrosion inhibitor. In one or more embodiments, the secondary solvent can be one or more alcohols, alkylene glycols, or alkylene glycol ethers. In one or more embodiments, the secondary solvent comprises one or more solvents selected from the group consisting of ethanol, 1-propanol, 2-propanol, n-butanol, propylene glycol, 2-methoxyethanol, 2-ethoxyethanol, propylene glycol propyl ether, dimethyl sulfoxide, and ethylene glycol.

In one or more embodiments, the secondary solvent is in an amount of from at least about 0.0025% (e.g., at least about 0.005%, at least about 0.01%, at least about 0.02%, at least about 0.05%, at least about 0.1%, at least about 0.2%, at least about 0.4%, at least about 0.6%, at least about 0.8%, or at least about 1%) by weight to at most about 5% (e.g., at most about 4%, at most about 3%, at most about 2%, at most about 1%, at most about 0.8%, at most about 0.6%, at most about 0.5%, or at most about 0.1%) by weight of the polishing composition described herein.

In one or more embodiments, the polishing composition can optionally include a dynamic surface tension reducer (DSTR). In some embodiments, the DSTR is an acetylenic compound. In some embodiments, the DSTR is an acetylene glycol or an ethoxylated adduct thereof. In some embodiments, the DSTR is an ethoxylated adduct of 2,4,7,9-tetramethyl-5-decyne-4,7-diol. In one or more embodiments, the DSTR can be in an amount of from at least about 0.0001% (e.g., at least about 0.0005%, at least about 0.001%, at least about 0.005, at least about 0.01%, at least about 0.05%, at least about 0.1%, at least about 0.2%, at least about 0.4%, or at least about 0.5%) to at most about 1% (e.g., at most about 0.8%, at most about 0.6%, at most about 0.5%, at most about 0.4%, at most about 0.2%, at most about 0.1%, at most about 0.05%, at most about 0.01%, at most about 0.005%, or at most about 0.001%) by weight of the polishing compositions described herein. In one or more embodiments, a POU polishing composition can include from about 0.0001% to 0.005% by weight of DSTR. In one or more embodiments, a concentrated polishing composition can include from about 0.001 to 1% by weight of DSTR.

In one or more embodiments, the polishing composition described herein can be substantially free of one or more of certain ingredients, such as organic solvents, pH adjusting agents, quaternary ammonium compounds (e.g., salts or hydroxides), amines, alkali bases (such as alkali hydroxides), fluoride containing compounds, silanes (e.g., alkoxysilanes), imines (e.g., amidines such as 1,8-diazabicyclo[5.4.0]-7-undecene (DBU) and 1,5-diazabicyclo[4.3.0]non-5-ene (DBN)), salts (e.g., halide salts or metal salts), polymers (e.g., cationic or anionic polymers), surfactants (e.g., cationic surfactants, anionic surfactants, or non-ionic surfactants), plasticizers, oxidizing agents (e.g, $H_2O_2$), corrosion inhibitors (e.g., azole or non-azole corrosion inhibitors), and/or certain abrasives (e.g., ceria abrasives, non-ionic abrasives, surface modified abrasives, or negatively/positively charged abrasive). The halide salts that can be excluded from the polishing compositions include alkali metal halides (e.g., sodium halides or potassium halides) or ammonium halides (e.g., ammonium chloride), and can be chlorides, bromides, or iodides. As used herein, an ingredient that is "substantially free" from a polishing composition refers to an ingredient that is not intentionally added into the polishing composition. In some embodiments, the polishing composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing composition. In some embodiments, the polishing composition described herein can be completely free of one or more of the above ingredients.

The present disclosure also contemplates a method of using any of the above-described polishing compositions (e.g., concentrates or POU slurries). With the concentrate, the method can comprise the steps of diluting the concentrate to form a POU slurry (e.g., by a factor of at least two), and then contacting a surface at least partially comprising copper with the POU slurry. In some embodiments, an oxidizer can be added to the slurry before, after, or during the dilution. With the POU slurry, the method comprises the step of contacting a surface at least partially comprising copper with the slurry.

In one or more embodiments, this disclosure features a polishing method that can include applying a polishing composition according to the present disclosure to a substrate (e.g., a wafer) having at least copper (e.g., in the form of a copper wire and/or copper overburden) on a surface of the substrate; and bringing a pad into contact with the surface of the substrate and moving the pad in relation to the substrate. In some embodiments, when the substrate includes at least one or more of copper, the above method can effectively polish the substrate (e.g., removing at least the copper overburden without leaving copper residue or galvanic corrosion occurring at the interface between copper and the barrier material (e.g., Ta/TaN).

In one or more embodiments, the method that uses a polishing composition described herein can further include producing a semiconductor device from the substrate treated by the polishing composition through one or more steps. For example, photolithography, ion implantation, dry/wet etching, plasma etching, deposition (e.g., PVD, CVD, ALD, ECD), wafer mounting, die cutting, packaging, and testing can be used to produce a semiconductor device from the substrate treated by the polishing composition described herein.

The specific examples below are to be construed as merely illustrative, and not limitative of the remainder of the disclosure in any way whatsoever. Without further elaboration, it is believed that one skilled in the art can, based on the description herein, utilize the present invention to its fullest extent.

EXAMPLES

The slurries tested in the examples included the following general formulation. The amounts and types of the first corrosion inhibitor were varied as will be explained when discussing the results and in the accompanying FIGS. 1-3.

TABLE 1

| Component | % By Weight of Composition |
|---|---|
| pH adjuster (acid) | 0.05-1 (if used) |
| First Corrosion Inhibitor-(Compound including a phosphate or a phosphonate moiety) | 0.00025-0.1 (if used) |
| Complexing Agent | 0.01-2 |
| Second Corrosion Inhibitor-(Azole containing Compound) | 0.0001-1 |
| Abrasive (silica) | 0.01-12 |
| Oxidizer | 0.01-5 |
| Solvent (DI Water) | 79-99 |
| pH | 5-10 |

Example 1—$Cu_2O$ and CuO Dissolution

This example is designed to test the ability of additives to modify the polishing of a substrate including copper. The test procedure was as follows. An amount of copper oxide (e.g., 0.01 g $Cu_2O$ or 0.005 g CuO) powder was weighed and placed into a centrifuge tube. A 25 g slurry sample including the components described above was added into the centrifuge tube such that the copper oxide powder was immersed in the slurry sample. The centrifuge tube was placed into an ultrasonic bath kept at 25° C. and was subject to ultrasonic treatment for two minutes. The mixture in the tube was then centrifuged at 10000 RPM for 40 minutes. A 10 mL sample of the supernatant was then extracted for ICP-MS analysis to determine the copper content in the supernatant. Polishing slurry samples including four first corrosion inhibitors, i.e., an alkyl phosphate, two distinct ethoxylated alkyl phosphate and an aromatic phosphonate, were tested. The four first corrosion inhibitors had a molecular weights that ranged from about 150 g/mol to about 1100 g/mol.

Figure 2:
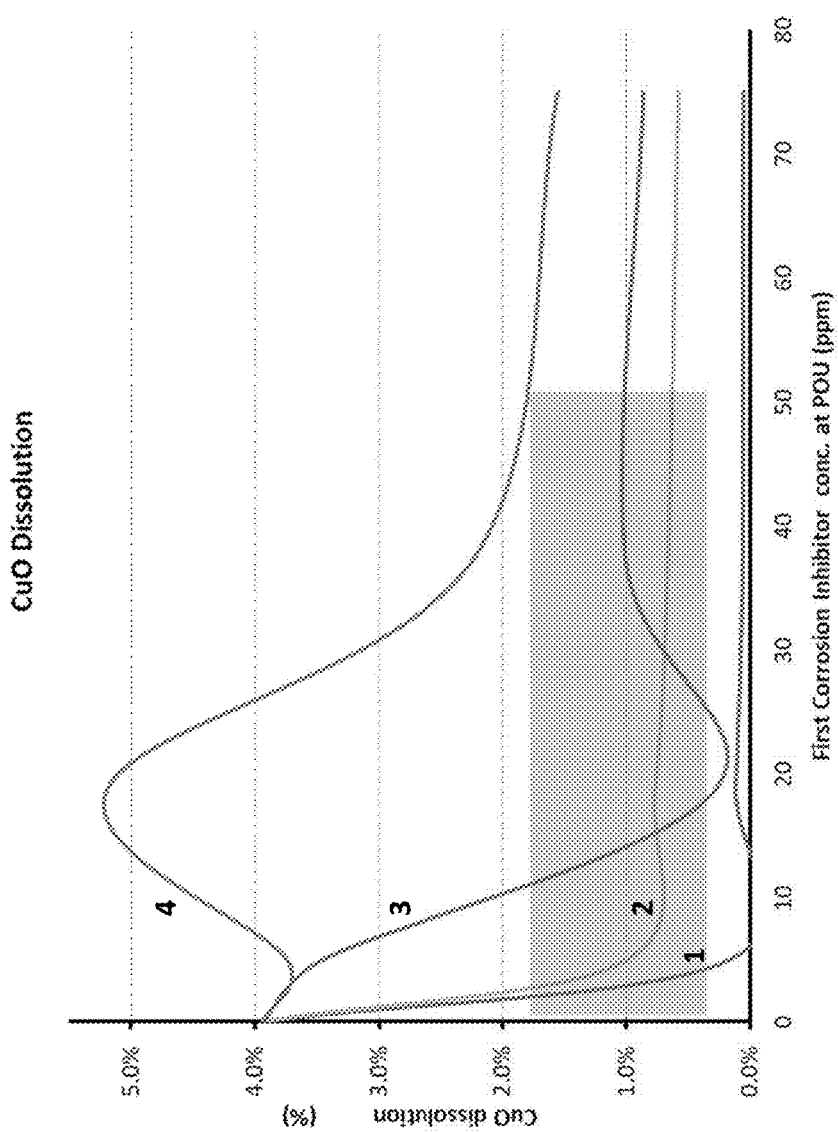
FIG. 2 is a plot illustrating the CuO dissolution by polishing compositions containing four different first corrosion inhibitors at various POU concentrations.

The results for the $Cu_2O$ dissolution are shown in FIG. 1 and the results for CuO dissolution are shown in FIG. 2. The results show that corrosion inhibitor 1 had a very profound effect, even at low doses, on inhibiting the dissolution of the copper oxides, effectively stopping their dissolution in the slurry when added at about 5 ppm to the slurry. Corrosion inhibitors 2 and 3 showed more moderate ability to inhibit the dissolution of copper oxides. FIG. 1 and FIG. 2 show that corrosion inhibitor 4 initially increased the dissolution of copper oxides at lower dosing levels before serving to inhibit dissolution at higher dosing levels.

Example 2—Patterned Coupon Static Etch Rate

Figure 3:
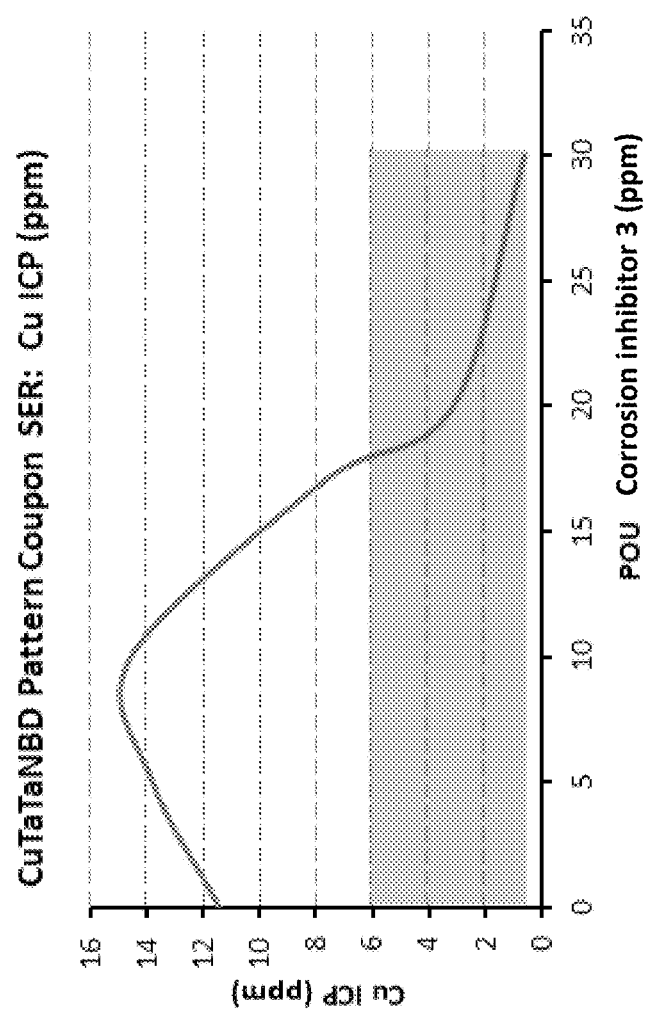
FIG. 3 is a plot illustrating the Cu ion concentration in a liquid sample collected and then measured by ICP after a CuTaTaNBD pattern coupon is treated by a polishing composition containing a first corrosion inhibitor.

In this example, a Static Etch Rate test was performed by immersing patterned coupons in a polishing composition that include corrosion inhibitor 3 and measuring the dissolved copper by ICP-MS. More specifically, a 4 cm×4 cm copper containing patterned coupon was placed in 50 g of a polishing composition containing corrosion inhibitor 3 and was incubated at 45° C. for 5 minutes. The dissolved copper in the polishing composition solution was then measured by ICP-MS. The copper containing patterned coupon was a piece of a CuTaTaNBD 854 mask 200 mm patterned wafer that was initially polished to substantially remove the copper overburden and thereby expose the copper wiring pattern. FIG. 3 shows the results of the Static Etch Rate Test demonstrating a similar plot profile as those obtained in FIGS. 1 and 2 for the composition using corrosion inhibitor 3.

Example 3—Copper Bulk Polishing with Patterned Wafers

In this example, CuTaTaNBD 854 mask 200 mm patterned wafers were polished using compositions that contained CI-1 to CI-4 and the other components in the amounts listed in Table 1 above to complete the copper bulk removal process, stopping on the barrier layer. Table 1 describes the resulting wafer by whether the polishing was acceptable (i.e., Cu-polish rate was sufficient and no defects were observed) or not acceptable. Acceptable polishing results are represented by a "●" in Table 2 and not acceptable results are indicated by an "x".

TABLE 2

| Corrosion Inhibitor | Amount of Corrosion Inhibitor Included in Polishing Composition (ppm) | | | | | | | Potential Reason for Not Acceptable Polishing Results |
|---|---|---|---|---|---|---|---|---|
| | 2.5 | 5 | 10 | 20 | 30 | 40 | 75 | |
| Corrosion inhibitor 1 | ● | x | x | x | x | x | x | Too strong Cu protection leading to Cu-residue issues and Cu-rate issues at 5-75 ppm. |
| Corrosion inhibitor-2 | x | ● | ● | ● | x | x | x | Too weak of Cu-protection leading to galvanic corrosion at interface of Cu and barrier material at 2.5 ppm. Too strong Cu protection leading to Cu-residue issues and Cu-rate issues at 30, 40, and 75 ppm. |
| Corrosion inhibitor- | x | x | x | ● | ● | ● | x | Too weak of Cu-protection leading to galvanic corrosion at interface of Cu and |

TABLE 2-continued

| Corrosion Inhibitor | Amount of Corrosion Inhibitor Included in Polishing Composition (ppm) | | | | | | | Potential Reason for Not Acceptable Polishing Results |
|---|---|---|---|---|---|---|---|---|
| | 2.5 | 5 | 10 | 20 | 30 | 40 | 75 | |
| 3 | | | | | | | | barrier material at 2.5, 5, and 10 ppm. Low Cu rates at 75 ppm. |
| Corrosion inhibitor-4 | x | x | x | x | x | x | x | Too weak of Cu-protection leading to galvanic corrosion at interface of Cu and barrier material. Also, low Cu rates at higher dosages. |

Importantly, during a polishing process, there generally is a balance that needs to be achieved between removal of the copper oxides and inhibiting the removal of the copper oxides so that the polishing can proceed homogenously and with few corrosion related defects. The inventors have surprisingly found that, in some embodiments, this optimal polishing balance can be achieved for copper containing substrates when using a polishing slurry that keeps the $Cu_2O$ and CuO dissolution % values within the shaded region of the plots shown in FIGS. 1 and 2.

Specifically, the suitable $Cu_2O$ dissolution % range is about 3-10% and the suitable CuO dissolution % range is about 0.25-1.75%. FIG. 3 shows a suitable polishing result window in the shaded region, which is from about 0.5 ppm to about 6 ppm of Cu dissolved in a polishing composition. Further, it was generally seen based on the results for the testing done in Example 3 that, the Cu-polish rate became unacceptably low once the concentration of first corrosion inhibitor was above 50 ppm in the polishing slurry. Thus, it was found surprisingly that each first corrosion inhibitor tested has a concentration window where it is amenable to polishing a copper containing substrate and, once outside of the concentration window, a polishing composition containing one of the tested first corrosion inhibitor may not be capable of adequately polishing a copper containing substrate due to poor polishing rate and/or high defect counts resulting from uncontrolled copper corrosion.

Note that, although Examples 3 shows that a polishing composition containing a particular first corrosion inhibitor (e.g., one of the four tested corrosion inhibitors) at a certain concentration may have unacceptable polishing results for the specific purpose and conditions described in Example 3, it is possible that such a first corrosion inhibitor can form a polishing composition having acceptable results when used in combination with other components described herein at different concentrations or form a polishing composition having acceptable results for a different polishing application. Thus, the polishing compositions that are listed as achieving "not acceptable" results in Example 3 are still within the scope of this disclosure.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A polishing composition, comprising:
   at least one abrasive;
   at least one first corrosion inhibitor selected from the group consisting of aromatic phosphonates, polyoxyethylene alkyl ether phosphonates, polyoxyethylene aryl alkyl ether phosphonates, polyoxyethylene nonylaryl ether phosphonates, and polyoxyethylene nonylphenyl ether phosphonates;
   at least one complexing agent;
   at least one second corrosion inhibitor, the at least one second corrosion inhibitor comprising at least one azole compound; and
   optionally at least one pH adjuster;
   wherein the amount of the at least one first corrosion inhibitor in the polishing composition is from about 1 ppm to about 2000 ppm of the composition and is an amount such that the polishing composition dissolves from at least about 3% by weight to at most about 10% by weight $Cu_2O$ from a solid $Cu_2O$ powder at a weight ratio of $Cu_2O$ to polishing composition of about 1:2500 when the solid $Cu_2O$ powder has an average particle size of from about 0.01 micron to about 500 microns and is immersed in the polishing composition at 25° C. for two minutes under agitation to form a mixture, the mixture is centrifuged to form a supernatant, and the amount of Cu ions dissolved in the supernatant is measured by ICP-MS.

2. The polishing composition of claim 1, wherein the at least one abrasive is selected from the group consisting of alumina, silica, titania, ceria, zirconia, co-formed products of alumina, silica, titania, ceria, or zirconia, coated abrasives, surface modified abrasives, and mixtures thereof.

3. The polishing composition of claim 1, wherein the at least one abrasive is in an amount of from about 0.01% to about 50% by weight of the composition.

4. The polishing composition of claim 1, wherein the amount of the at least one first corrosion inhibitor is from about 2.5 ppm to about 50 ppm of the composition.

5. The polishing composition of claim 1, wherein the at least one first corrosion inhibitor has a molecular weight from about 150 g/mol to about 1100 g/mol.

6. The polishing composition of claim 1, wherein the at least one complexing agent is selected from the group consisting of organic acids, amines, ammonia, quaternary ammonium compounds, inorganic acids, and salts and mixtures thereof.

7. The polishing composition of claim 1, wherein the at least one complexing agent is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, ammonia, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethanesulfonic acid, ethyl phosphoric acid, cyanoethyl phosphoric acid, phenyl phosphoric acid, vinyl phosphoric acid, poly (vinylphosphonic acid), 1-hydroxyethane-1,1-diphosphonic acid, nitrilotri(methylphosphonic acid), diethylenetriaminepentakis (methylphosphonic acid), N,N,N',N'-ethylenediaminetetrakis(methylene phosphonic acid), n-hexylphosphonic acid, benzylphosphonic acid, phenylphosphonic acid, salts thereof, and mixtures thereof.

8. The polishing composition of claim 1, wherein the at least one complexing agent is in an amount from about 0.01% to about 20% by weight of the composition.

9. The polishing composition of claim 1, wherein the at least one second corrosion inhibitor is selected from the group consisting of tetrazole, benzotriazole, tolyltriazole, 5-methylbenzotriazole, ethyl benzotriazole, propyl benzotriazole, butyl benzotriazole, pentyl benzotriazole, hexyl benzotriazole, dimethyl benzotriazole, chloro benzotriazole, dichloro benzotriazole, chloromethyl benzotriazole, chloroethyl benzotriazole, phenyl benzotriazole, benzyl benzotriazole, aminotriazole, aminobenzimidazole, pyrazole, imidazole, aminotetrazole, adenine, benzimidazole, thiabendazole, 1,2,3-triazole, 1,2,4-triazole, 1-hydroxybenzotriazole, 2-methylbenzothiazole, 2-aminobenzimidazole, 2-amino-5-ethyl-1,3,4-thiadazole, 3,5-diamino-1,2,4-triazole, 3-amino-5-methylpyrazole, 4-amino-4H-1,2,4-triazole, and combinations thereof.

10. The polishing composition of claim 1, wherein the at least one second corrosion inhibitor is in an amount from about 0.0001% to about 5% by weight of the composition.

11. A polishing composition, comprising:
at least one abrasive;
at least one first corrosion inhibitor selected from the group consisting of aromatic phosphonates, polyoxyethylene alkyl ether phosphonates, polyoxyethylene aryl alkyl ether phosphonates, polyoxyethylene nonylaryl ether phosphonates, and polyoxyethylene nonylphenyl ether phosphonates;
at least one complexing agent;
at least one second corrosion inhibitor, the at least one second corrosion inhibitor comprising at least one azole compound; and
optionally at least one pH adjuster;
wherein the amount of the at least one first corrosion inhibitor in the polishing composition is from about 1 ppm to about 2000 ppm of the composition and is in an amount such that, when a 4 cm×4 cm copper containing patterned coupon is immersed in 50 g of the polishing composition at 45° C. for 5 minutes to form a mixture, the amount of the Cu species in the mixture is from about 1 ppm to about 10 ppm as measured by ICP-MS.

12. The polishing composition of claim 11, wherein the at least one abrasive is selected from the group consisting of alumina, silica, titania, ceria, zirconia, co-formed products of alumina, silica, titania, ceria, or zirconia, coated abrasives, surface modified abrasives, and mixtures thereof.

13. The polishing composition of claim 11, wherein the at least one abrasive is in an amount of from about 0.01% to about 50% by weight of the composition.

14. The polishing composition of claim 11, wherein the amount of the at least one first corrosion inhibitor is from about 2.5 ppm to about 50 ppm of the composition.

15. The polishing composition of claim 11, wherein the at least one first corrosion inhibitor has a molecular weight from about 150 g/mol to about 1100 g/mol.

16. The polishing composition of claim 11, wherein the at least one complexing agent is selected from the group consisting of organic acids, amines, ammonia, quaternary ammonium compounds, inorganic acids, and salts and mixtures thereof.

17. The polishing composition of claim 11, wherein the at least one complexing agent is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, ammonia, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethanesulfonic acid, ethyl phosphoric acid, cyanoethyl phosphoric acid, phenyl phosphoric acid, vinyl phosphoric acid, poly (vinylphosphonic acid), 1-hydroxyethane-1,1-diphosphonic acid, nitrilotri(methylphosphonic acid), diethylenetriaminepentakis (methylphosphonic acid), N,N,N',N'-ethylenediaminetetrakis(methylene phosphonic acid), n-hexylphosphonic acid, benzylphosphonic acid, phenylphosphonic acid, salts thereof, and mixtures thereof.

18. The polishing composition of claim 11, wherein the at least one complexing agent is in an amount from about 0.01% to about 20% by weight of the composition.

19. The polishing composition of claim 11, wherein the at least one second corrosion inhibitor is selected from the group consisting of tetrazole, benzotriazole, tolyltriazole, 5-methylbenzotriazole, ethyl benzotriazole, propyl benzotriazole, butyl benzotriazole, pentyl benzotriazole, hexyl benzotriazole, dimethyl benzotriazole, chloro benzotriazole, dichloro benzotriazole, chloromethyl benzotriazole, chloroethyl benzotriazole, phenyl benzotriazole, benzyl benzotriazole, aminotriazole, aminobenzimidazole, pyrazole, imidazole, aminotetrazole, adenine, benzimidazole, thiabendazole, 1,2,3-triazole, 1,2,4-triazole, 1-hydroxybenzotriazole, 2-methylbenzothiazole, 2-aminobenzimidazole, 2-amino-5-ethyl-1,3,4-thiadazole, 3,5-diamino-1,2,4-triazole, 3-amino-5-methylpyrazole, 4-amino-4H-1,2,4-triazole, and combinations thereof.

20. The polishing composition of claim 11, wherein the at least one second corrosion inhibitor is in an amount from about 0.0001% to about 5% by weight of the composition.

21. A method of polishing a substrate, comprising:
contacting copper on a surface of the substrate with the polishing composition of claim 1.

* * * * *